(12) United States Patent
Kim

(10) Patent No.: US 8,773,867 B2
(45) Date of Patent: Jul. 8, 2014

(54) CAMERA MODULE FOR SHIELDING EMI

(75) Inventor: Yong-Gu Kim, Seoul (KR)

(73) Assignee: Samsung Electro-Mechanics Co., Ltd., Suwon-Si, Gyeonggi-Do (KR)

( * ) Notice: Subject to any disclaimer, the term of this patent is extended or adjusted under 35 U.S.C. 154(b) by 187 days.

(21) Appl. No.: 13/181,789

(22) Filed: Jul. 13, 2011

(65) Prior Publication Data

US 2012/0039060 A1 Feb. 16, 2012

(30) Foreign Application Priority Data

Aug. 11, 2010 (KR) .......................... 10-2010-0077353

(51) Int. Cl.
*H05K 9/00* (2006.01)

(52) U.S. Cl.
USPC ........... 361/799; 348/374; 361/800; 361/816; 361/818

(58) Field of Classification Search
USPC .................... 361/799, 800, 816, 818; 348/374
See application file for complete search history.

(56) References Cited

U.S. PATENT DOCUMENTS

| | | | | |
|---|---|---|---|---|
| 5,898,344 A | * | 4/1999 | Hayashi | 331/67 |
| 7,126,111 B2 | * | 10/2006 | Webster | 250/239 |
| 7,554,599 B2 | * | 6/2009 | Tu et al. | 348/340 |
| 7,660,132 B2 | * | 2/2010 | Tanaka | 361/816 |
| 7,876,513 B2 | * | 1/2011 | Tamoyama et al. | 359/819 |
| 8,610,824 B2 | * | 12/2013 | Kim | 348/374 |
| 2010/0157137 A1 | * | 6/2010 | Imai et al. | 348/362 |

FOREIGN PATENT DOCUMENTS

| | | |
|---|---|---|
| CN | 101449635 A | 6/2009 |
| KR | 10-0876109 B1 | 12/2008 |

OTHER PUBLICATIONS

Richard Perez, How to Solder, Apr./May 2002, Home Power, #88, p. 74.*
Korean Office Action, with partial English translation, issued in Korean Patent Application No. 10-2010-0077353, dated Oct. 7, 2011.
First Office Action issued in Chinese Application No. 201110191720.7 with Date of mail: Nov. 5, 2013, with English Translation.
Search Report issued in Chinese Application No. 201110191720.7 dated Oct. 28, 2013.

* cited by examiner

*Primary Examiner* — Anatoly Vortman
*Assistant Examiner* — Jacob Crum
(74) *Attorney, Agent, or Firm* — McDermott Will & Emery LLP

(57) ABSTRACT

A camera module is disclosed. The camera module in accordance with the present invention includes: a printed circuit board having a grounding pad formed on one surface thereof; a housing mounted on an upper side of the printed circuit board and including a lens inside thereof; a shield covering the housing in order to shield electromagnetic waves from an outside and having an opening cavity formed therein in correspondence with a location of the grounding pad; and a solder formed in the opening cavity and connecting the shield with the grounding pad.

2 Claims, 3 Drawing Sheets

CAMERA MODULE FOR SHIELDING EMI

CROSS-REFERENCE TO RELATED APPLICATIONS

This application claims the benefit of Korean Patent Application No. 10-2010-0077353, filed with the Korean Intellectual Property Office on Aug. 11, 2010, the disclosure of which is incorporated herein by reference in its entirety.

BACKGROUND

1. Technical Field

The present invention is related to a cameral module.

2. Background Art

When a camera module is installed in a main body of a mobile device, a shield is ordinarily introduced to shield electronic interference for electronic signals outputted from an image sensor or other electronic components.

When the mobile device is assembled, a grounding part is separately arranged on an external side of the shield, and a grounding pad is formed on an upper surface of a printed circuit board, and the grounding part and the grounding pad are soldered to each other.

However, it is difficult to find an appropriate amount of lead that is soldered. That is, in case there is an excessive amount of soldered lead, other components and parts may be damaged, and in case the space required for soldering is expanded in order to avoid such damage, the overall size of the camera module may be increased against the trend of making the overall camera module smaller. On the contrary, in case there is an insufficient amount of soldered lead, the grounding pad and the grounding part may not be properly grounded.

SUMMARY

The present invention provides a camera module that can be soldered in a stable manner and can properly regulate a solder.

The present invention also provides a camera module that can apply an efficient space for soldering.

An aspect of the present invention features a camera module, which can include: a printed circuit board having a grounding pad formed on one surface thereof; a housing mounted on an upper side of the printed circuit board and including a lens inside thereof; a shield covering the housing in order to shield electromagnetic waves from an outside and having an opening cavity formed therein in correspondence with a location of the grounding pad; and a solder formed in the opening cavity and connecting the shield with the grounding pad.

The shield can include: a shield body having a shape in which a lower side thereof is open; and a plurality of covers having a shape of protruding downwardly at a lower end part of the shield body.

The plurality of covers can be separated from one another, and a space between the separated plurality of covers can form the opening cavity.

The cover can be bent toward an outside so as to form an inner space for accommodating solder that is excessively injected.

The opening cavity can be formed at a corner of the shield.

DETAILED DESCRIPTION

Figure 1:
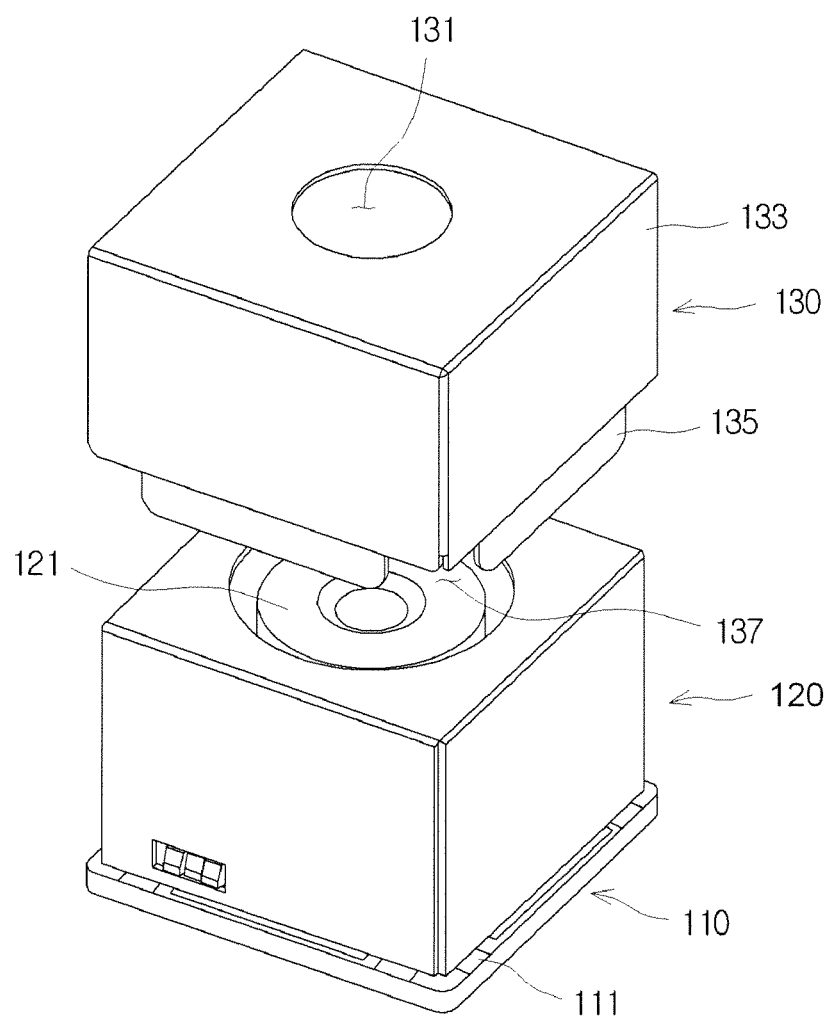
FIG. 1 is a separated perspective view showing a camera module in accordance with an embodiment of the present invention.
Figure 2:
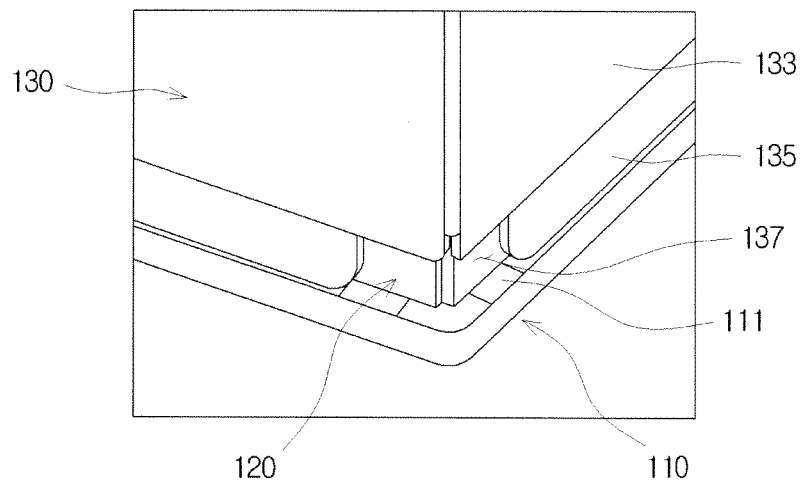
FIG. 2 is a perspective view showing an opening cavity of a camera module in accordance with an embodiment of the present invention.
Figure 3:
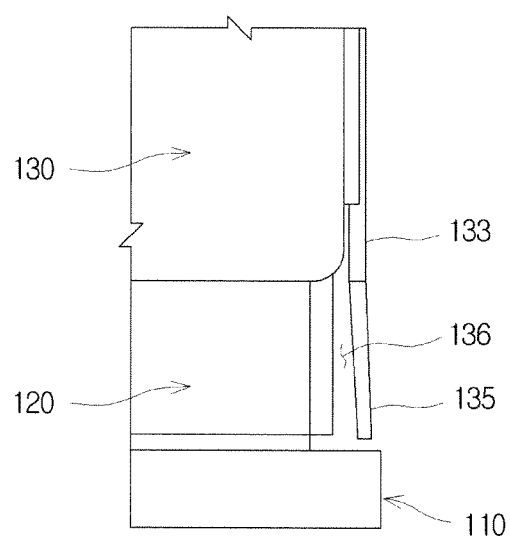
FIG. 3 is a side view showing the opening cavity of a camera module in accordance with an embodiment of the present invention.
Figure 4:
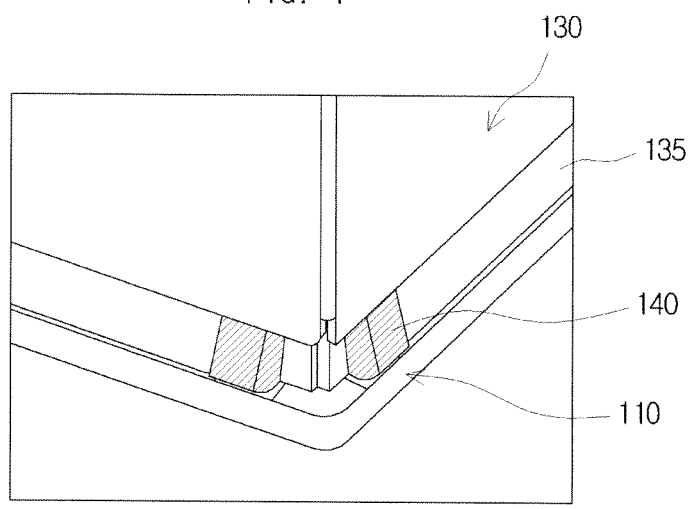
FIG. 4 is a perspective view showing a solder formed in the opening cavity of a camera module in accordance with an embodiment of the present invention.
Figure 5:
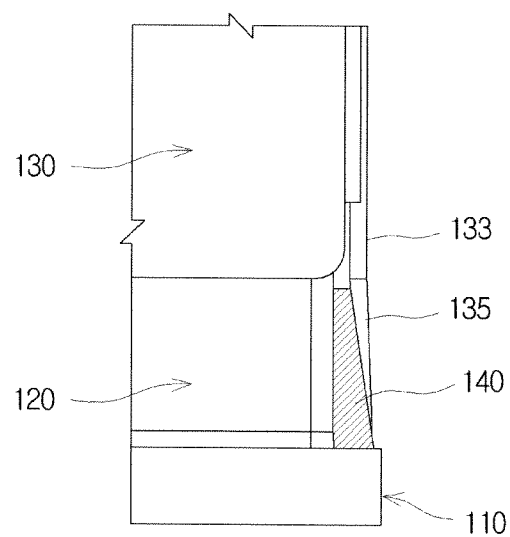
FIG. 5 is a cross-sectional view showing the solder formed in the opening cavity of a camera module in accordance with an embodiment of the present invention.

Since there can be a variety of permutations and embodiments of the present invention, certain embodiments will be illustrated and described with reference to the accompanying drawings. This, however, is by no means to restrict the present invention to certain embodiments, and shall be construed as including all permutations, equivalents and substitutes covered by the ideas and scope of the present invention. Throughout the description of the present invention, when describing a certain technology is determined to evade the point of the present invention, the pertinent detailed description will be omitted.

Terms such as "first" and "second" can be used in describing various elements, but the above elements shall not be restricted to the above terms. The above terms are used only to distinguish one element from the other.

The terms used in the description are intended to describe certain embodiments only, and shall by no means restrict the present invention. Unless clearly used otherwise, expressions in a singular form include a meaning of a plural form. In the present description, an expression such as "comprising" or "including" is intended to designate a characteristic, a number, a step, an operation, an element, a part or combinations thereof, and shall not be construed to preclude any presence or possibility of one or more other characteristics, numbers, steps, operations, elements, parts or combinations thereof.

Hereinafter, a certain embodiment of a camera module in accordance with the present invention will be described in detail with reference to the accompanying drawings. Identical or corresponding elements will be given the same reference numerals, regardless of the figure number, and any redundant description of the identical or corresponding elements will not be repeated.

FIG. 1 is a separated perspective view showing a camera module in accordance with an embodiment of the present invention, and FIGS. 2 to 5 show a portion of the camera module in accordance with an embodiment of the present invention.

Referring to FIGS. 1 to 5, a camera module 100, a printed circuit board 110, a grounding pad 111, a housing 120, a lens 121, a shield 130, a shield body 133, a cover 135, an opening cavity 137 and a solder 140 are illustrated.

The printed circuit board 110 has the grounding pad 111 formed on one surface thereof. The printed circuit board 110 is electrically connected with a main board (not shown) and can be formed with a circuit pattern such that electrical signals can be inputted and outputted. Also, it is possible that the printed circuit board 110 is embodied in a module together with an image sensor (not shown) and that various kinds of electronic and electrical components, such as condenser, resistor, etc., for driving the image sensor can be mounted in the printed circuit board 110.

The housing 120 is mounted over the printed circuit board 110 and has the lens 121 inside thereof.

An adhesive is coated on one surface of the housing 120 that comes in contact with the printed circuit board 110 to allow the housing 120 and printed circuit board 110 to be coupled to each other. It shall be appreciated that the housing 120 and the printed circuit board 110 can be also coupled by various other physical/chemical coupling methods.

There can be at least one lens 121 inside the housing 120, and it is possible to perform a function of allowing an external light source to be focused on the image sensor through the lens 121.

The housing 120 can be formed in a hollow type such that a path for the light source inputted through the lens 121 can be provided, and a portion of an upper part of the housing 120 is opened. By coupling the lens 121 to an inside of the upper part of the housing 120 and coupling the printed circuit board 110, in which the image sensor is mounted, to a lower part of the housing 120, it becomes possible for the light source that has passed through the lens 121 to reach the image sensor through the inside of the hollow-type housing 120.

The shield 130, which shields the interference of electromagnetic waves, can be arranged on an external side of the housing 120, and the shield 130 can surround an upper part of the printed circuit board 110. For example, a space for mounting a configuration such as the housing 120 is formed inside a hexahedral shield 130.

The shield 130, the housing 120 and the grounding pad 111 are soldered, but controlling the amount of lead for such soldering is not easy. This is because the external appearance may be poor or the electromagnetic waves may not be shielded due to failure of grounding, if the amount of soldering is incorrectly controlled due to the difficulty in soldering area or soldering size.

However, in the present embodiment, the shield 130 covers the housing 120 in order to shield the electromagnetic waves from the outside, and the opening cavity 137 is formed to correspond to the location of the grounding pad 111.

The shield 130 can be made of a metallic material in order to be connected with the grounding pad 111, and such metallic material can be, for example, aluminum, which is less expensive than gold and copper and thus can save the production cost.

The shield 130 can include the shield body 133, the cover 135 and the opening cavity 137.

The shield body 133 can have a shape in which a bottom side thereof is open. For example, the shield body 133 in a hexahedral shape covers the housing 120, and an upper part of the shield body 133 has an opening 131 that is open together with the housing 120 about an optical axis, such that a path for the light source can be provided.

The cover 135 can be arranged in a plural number in the shape of protruding downwardly at a lower end part of the shield body 133. The plurality of covers 135 are separated from one another, and a space 136 between the plurality of separated covers 135 can form the opening cavity 137.

For example, the grounding pad 111 can be formed at a corner of the printed circuit board 110, and the opening cavity 137 can be formed at a corner of the shield 130 in correspondence with the location of the grounding pad 111.

The opening cavity 137 can be a space formed by removing one side of the cover 135 by way of drilling, milling, punching, etc. On the contrary, the opening cavity 137 can be a space formed by making a transverse length of the cover 135 shorter than a transverse length of the shield body 133.

The plurality of covers 135 can be formed at the lower end part of the shield body 133 along a transverse-lengthwise direction of each side wall of the shield body 133. The covers 135 can be separated from one another so that the opening cavity 137 can be formed at a corner of the shield 130, and the cover 135 can be placed at a lower center area of each side wall of the shield body 133. The cover 135 can have the shape of a rectangular parallelepiped with a longer transverse length.

The cover 135 can accommodate the solder 140 that is excessively injected. For this, the space 136 can be formed on one side of the cover 135. For example, as the cover 135 can be extended to a lower side of the shield cover 133 and bent toward the outside, the space 136 can be formed between the cover 135 and the housing 120 facing the cover 135 due to the cover 135 that is bent toward the outside and separated from the housing 120.

Accordingly, if the solder 140 is excessively injected between the grounding pad 111 and the opening cavity 137, the solder 140 can enter the space 136 between the housing 120 and the cover 135 and can be prevented from overflowing by.

Here, the solder 140 is formed in the opening cavity 137 to connect the shield 130 with the grounding pad 111. By forming the solder 140 by use of soldering, the grounding pad 111, the housing 120 and the shield 130 can be connected with one another.

The camera module in accordance with the embodiment described above can prevent the solder, even if it is excessively injected, from short-circuiting other components of the mobile device and reduce defective production by preventing poor appearance caused by soldering.

Moreover, the camera module in accordance with the embodiment described above can reduce the size of the camera module because the solder can be formed inside the shield without forming the grounding part on the outside of the shield.

Although a certain embodiment of the present invention has been described, it shall be appreciated that there can be a very large number of permutations and modification of the present invention by those who are ordinarily skilled in the art to which the present invention pertains without departing from the technical ideas and boundaries of the present invention, which shall be defined by the claims appended below.

It shall be also appreciated that many other embodiments other than the embodiment described above are included in the claims of the present invention.

What is claimed is:

1. A camera module comprising:
   a printed circuit board having a grounding pad disposed on one surface thereof;
   a housing mounted on an upper side of the printed circuit board and comprising a lens inside thereof;
   a shield covering the housing configured to shield electromagnetic waves from an outside and having an opening cavity formed therein in correspondence with a location of the grounding pad; and
   a solder disposed in the opening cavity and connecting the shield with the grounding pad,
   wherein the shield comprises:
   a shield body having a shape in which a lower side thereof is open; and
   a plurality of covers having a shape which protrudes downwardly at a lower end part of the shield body,
   wherein at least one of the plurality of covers is bent toward an outside so as to form an inner space for accommodating solder that is excessively injected, wherein the plurality of covers are separated from one another, and a space between the separated plurality of covers forms the opening cavity, and wherein the solder is disposed along a surface of the housing at a plurality of stand-alone locations which are exposed by the opening cavity, the covers of the shield and the grounding pad such that the shield, the housing and the grounding pad are directly bonded with one another by the solder at each of the plurality of stand-alone locations.

2. The camera module of claim 1, wherein the opening cavity is formed at a corner of the shield.

* * * * *